(12) United States Patent
Su (10) Patent No.: US 11,894,853 B2
(45) Date of Patent: Feb. 6, 2024

(54) DIFFERENTIAL SIGNAL SKEW CALIBRATION CIRCUIT AND SEMICONDUCTOR MEMORY

(71) Applicant: CHANGXIN MEMORY TECHNOLOGIES, INC., Hefei (CN)

(72) Inventor: Pengzhou Su, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 66 days.

(21) Appl. No.: 17/712,390

(22) Filed: Apr. 4, 2022

(65) Prior Publication Data
US 2022/0224345 A1    Jul. 14, 2022

Related U.S. Application Data

(63) Continuation of application No. PCT/CN2021/094240, filed on May 18, 2021.

(30) Foreign Application Priority Data

Jun. 2, 2020 (CN) .......................... 202010489144.3

(51) Int. Cl.
*H03L 7/183* (2006.01)
*H03K 19/1776* (2020.01)
(Continued)

(52) U.S. Cl.
CPC ......... *H03L 7/183* (2013.01); *H03K 19/1776* (2013.01); *H03K 19/20* (2013.01); *H03L 7/0818* (2013.01)

(58) Field of Classification Search
CPC ......... H03L 7/183; H03L 7/0818; H03K 3/70; H03K 19/1776; H03K 5/153; H03K 19/20;
(Continued)

(56) References Cited

U.S. PATENT DOCUMENTS

| 6,359,803 | B1 | 3/2002 | Tanaka | |
| 7,085,337 | B2 * | 8/2006 | Dyer | ...................... H04L 25/08 |
| | | | | 375/330 |

(Continued)

FOREIGN PATENT DOCUMENTS

| CN | 1790546 A | 6/2006 |
| CN | 1963797 A | 5/2007 |

(Continued)

OTHER PUBLICATIONS

Yuxiang Zheng, et al. "A 5 GB/s Automatic Within-Pair Skew Compensator for Differential Data in 0.13 um CMOS", Jun. 2011, pp. 1191-1202, IEEE Transactions on Circuits and Systems—1: Regular Papers. vol. 58, No. 6. (Year: 2011).*

(Continued)

*Primary Examiner* — Sophia Vlahos (74) *Attorney, Agent, or Firm* — Cooper Legal Group, LLC (57) ABSTRACT

Provided are a differential signal skew calibration circuit and a semiconductor memory. The differential signal skew calibration circuit may acquire a phase relationship of a differential signals through a phase detection circuit. A phase adjustment control circuit may generate a phase calibration control instruction according to the phase relationship of the differential signals to control a phase calibration circuit to calibrate a phase skew of the input differential signals.

18 Claims, 3 Drawing Sheets

(51) Int. Cl.
H03K 19/20 (2006.01)
H03L 7/081 (2006.01)

(58) Field of Classification Search
CPC ...... H03K 5/151; H03K 5/00; H03K 19/0175; H03K 3/017; H04L 25/0274; H04L 7/0008
See application file for complete search history.

(56) References Cited

U.S. PATENT DOCUMENTS

| | | | |
|---|---|---|---|
| 7,362,107 B2 | 4/2008 | Tseng | |
| 7,493,509 B2 * | 2/2009 | Fung | G06F 1/10 713/401 |
| 7,893,746 B1 * | 2/2011 | Zheng | H03H 11/26 327/263 |
| 8,917,113 B1 | 12/2014 | Song | |
| 8,929,496 B2 | 1/2015 | Lee | |
| 9,240,879 B2 | 1/2016 | Shi et al. | |
| 9,419,781 B2 | 8/2016 | Lee et al. | |
| 9,747,972 B2 | 8/2017 | Hashimoto | |
| 9,973,328 B2 | 5/2018 | Lee et al. | |
| 10,320,398 B2 | 6/2019 | Jeon et al. | |
| 10,432,389 B2 | 10/2019 | Lee et al. | |
| 10,530,371 B2 | 1/2020 | Jeon et al. | |
| 10,887,076 B2 | 1/2021 | Lee et al. | |
| 2006/0001462 A1 | 1/2006 | Kim et al. | |
| 2007/0046335 A1 * | 3/2007 | Becker | H03K 5/135 326/93 |
| 2007/0118251 A1 | 5/2007 | Tseng | |
| 2008/0130377 A1 * | 6/2008 | Chen | G11C 7/222 365/194 |
| 2009/0243682 A1 * | 10/2009 | Huang | H04L 25/0292 327/170 |
| 2010/0284489 A1 * | 11/2010 | Bae | H04L 25/085 375/296 |
| 2010/0289544 A1 | 11/2010 | Lee | |
| 2011/0156772 A1 * | 6/2011 | Lee | H03K 19/0175 327/155 |
| 2012/0269296 A1 * | 10/2012 | Chuang | H03F 3/45179 375/316 |
| 2015/0092898 A1 | 4/2015 | Lee et al. | |
| 2015/0180643 A1 | 6/2015 | Shi et al. | |
| 2015/0213878 A1 | 7/2015 | Hashimoto | |
| 2016/0065195 A1 * | 3/2016 | Farazian | H03K 5/1506 327/238 |
| 2017/0099132 A1 | 4/2017 | Lee et al. | |
| 2018/0123601 A1 | 5/2018 | Jeon et al. | |
| 2018/0323951 A1 | 11/2018 | Lee et al. | |
| 2019/0238141 A1 | 8/2019 | Jeon et al. | |
| 2020/0052873 A1 | 2/2020 | Lee et al. | |

FOREIGN PATENT DOCUMENTS

| | | |
|---|---|---|
| CN | 101926121 A | 12/2010 |
| CN | 101989466 A | 3/2011 |
| CN | 204142828 U | 2/2015 |
| CN | 104734695 A | 6/2015 |
| CN | 104467833 B | 1/2019 |

OTHER PUBLICATIONS

International Search Report and English Translation cited in PCT/CN2021/094240, dated Aug. 20, 2021, 5 pages.

* cited by examiner

DIFFERENTIAL SIGNAL SKEW CALIBRATION CIRCUIT AND SEMICONDUCTOR MEMORY

CROSS-REFERENCE TO RELATED APPLICATIONS

The present application is continuation of International Application PCT/CN2021/094240, filed on May 18, 2021, which claims priority to Chinese Patent Application No. 202010489144.3, filed with the CNIPA on Jun. 2, 2020, and entitled "Differential Signal Skew Calibration Circuit and Semiconductor Memory". The contents of International Application PCT/CN2021/094240 and Chinese Patent Application No. 202010489144.3 are hereby incorporated by reference in their entireties.

TECHNICAL FIELD

The application relates to the technical field of semiconductor memories, and particularly to a differential signal skew calibration circuit and a semiconductor memory.

BACKGROUND

A Dynamic Random Access Memory (DRAM) is a semiconductor memory. In the related art, a skew of input differential signals is ensured in a DRAM through specially designed wiring on a Printed Circuit Board (PCB).

However, with the increase of the complexity of a DRAM system and a clock frequency, the wiring space of a PCB is becoming narrow, resulting in cost increase of the DRAM system.

SUMMARY

Based on this, it is necessary to provide a differential signal skew calibration circuit and a semiconductor memory for the problem of cost increase caused by narrowing of a wiring space of a PCB.

The application provides a differential signal skew calibration circuit, which may include a phase calibration circuit, a phase detection circuit, and a phase adjustment control circuit.

The phase calibration circuit may be configured to calibrate a phase of differential signals.

A first end of the phase detection circuit may be connected with an output end of the phase calibration circuit. The phase detection circuit may be configured to perform a preset logical operation on the differential signals to generate a phase difference pulse signal, and acquire a phase relationship of the differential signals according to the differential signals and the phase difference pulse signal.

A first end of the phase adjustment control circuit may be connected with a second end of the phase detection circuit, a second end may be connected with a control end of the phase calibration circuit. The phase adjustment control circuit may be configured to receive the phase relationship, generate a phase calibration control instruction according to the phase relationship, and send the instruction to the phase calibration circuit to implement skew calibration of the differential signals.

In one embodiment, the phase detection circuit may include a first detection circuit and a second detection circuit.

A first end of the first detection circuit may be connected with the output end of the phase calibration circuit. The first detection circuit may be configured to perform the preset logical operation on the differential signals to generate a first phase difference pulse signal and a second phase difference pulse signal.

A first end of the second detection circuit may be connected with a second end of the first detection circuit, a second end may be connected with the first end of the phase adjustment control circuit. The second detection circuit may be configured to compare between amplitudes of the first phase difference pulse signal and the second phase difference pulse signal to obtain the phase relationship, and send the phase relationship to the phase adjustment control circuit.

In one embodiment, the first detection circuit may include a first logical unit, a phase delay unit, a second logical unit, and a third logical unit.

A first end of the first logical unit may be connected with the first end of the phase calibration circuit, a second end may be connected with a second end of the phase calibration circuit. The first logical unit may be configured to perform a first logical operation on a first signal and second signal in the differential signals to generate a phase difference signal. The first end of the phase calibration circuit and the second end of the phase calibration circuit may form the output end of the phase calibration circuit.

A first end of the phase delay unit may be connected with a third end of the first logical unit. The phase delay unit may be configured to perform phase delay processing on the phase difference signal to generate a phase delay signal.

A first end of the second logical unit may be connected with the first end of the phase calibration circuit, a second end may be connected with a second end of the phase delay unit. The second logical unit may be configured to perform a second logical operation on the phase delay signal and the first signal to generate the first phase difference pulse signal.

A first end of the third logical unit may be connected with the second end of the phase calibration circuit, a second end may be connected with the second end of the phase delay unit. The third logical unit may be configured to perform a third logical operation on the phase delay signal and the second signal to generate the second phase difference pulse signal.

In one embodiment, the first logical unit may include a NOR gate, and/or the second logical unit may include an AND gate, and/or the third logical unit may include an AND gate.

In one embodiment, the phase detection circuit may further include a controllable storage circuit.

A first end of the controllable storage circuit may be connected with the output end of the phase calibration circuit, a second end may be connected with the second end of the first detection circuit, and a third end may be connected with the first end of the second detection circuit. The controllable storage circuit may be configured to store the first phase difference pulse signal and the second phase difference pulse signal according to a period of the differential signals.

In one embodiment, the controllable storage circuit may include a first controllable storage unit and a second controllable storage unit.

A first end of the first controllable storage unit may be connected with the second end of the phase calibration circuit, a second end may be connected with a third end of the second logical unit, and a third end may be connected with the first end of the second detection circuit. The first controllable storage unit may be configured to generate a first storage control signal according to a period of the second signal, and receive and store, according to the first storage control signal, the first phase difference pulse signal or release the stored first phase difference pulse signal.

A first end of the second controllable storage unit may be connected with the first end of the phase calibration circuit, a second end may be connected with a third end of the third logical unit, and a third end may be connected with the first end of the second detection circuit. The second controllable storage unit may be configured to generate a second storage control signal according to a period of the first signal, and receive and store, according to the second storage control signal, the second phase difference pulse signal or release the stored first phase difference pulse signal.

In one embodiment, the first controllable storage unit may include a first frequency division subunit and a second storage subunit.

A first end of the first frequency division subunit may be connected with the second end of the phase calibration circuit. The first frequency division subunit may be configured to generate the first storage control signal according to the period of the second signal.

A first end of the first storage subunit may be connected with the third end of the second logical unit, a second end may be connected with a second end of the first frequency division subunit, and a third end may be connected with the first end of the second detection circuit. The first storage subunit may be configured to receive the first storage control signal, and store the first phase difference pulse signal according to the first storage control signal or release the stored first phase difference pulse signal.

In one embodiment, the first storage subunit may include a first voltage-controlled switch component, a second voltage-controlled switch component, and a first capacitor.

A first end of the first voltage-controlled switch component may be connected with the third end of the second logical unit, a second end may be connected with the second end of the first frequency division subunit. The first voltage-controlled switch component may be configured to receive the first storage control signal, and may be turned on or off according to the first storage control signal.

A first end of the second voltage-controlled switch component may be connected with a third end of the first voltage-controlled switch component, a second end may be connected with the second end of the first frequency division subunit. The second voltage-controlled switch component may be configured to receive an inverted signal of the first storage control signal, and may be turned on or off according to the inverted signal of the first storage control signal.

A first end of the first capacitor may be connected with the third end of the first voltage-controlled switch component and the first end of the second detection circuit respectively, a second end may be connected with a third end of the second voltage-controlled switch component and a ground respectively. The first capacitor may be configured to store the first phase difference pulse signal or release the stored first phase difference pulse signal.

In one embodiment, the first storage subunit may further include a first diode.

A first end of the first diode may be connected with the third end of the first voltage-controlled switch component, a second end may be connected with the first end of the second voltage-controlled switch component.

In one embodiment, the second controllable storage unit may include a second frequency division subunit and a second storage subunit.

A first end of the second frequency division subunit may be connected with the first end of the phase calibration circuit. The second frequency division subunit may be configured to generate the second storage control signal according to the period of the first signal.

A first end of the second storage subunit may be connected with the third end of the third logical unit, a second end may be connected with a second end of the second frequency division subunit, and a third end may be connected with the first end of the second detection circuit. The second storage subunit may be configured to receive the second storage control signal, and store the second phase difference pulse signal according to the second storage control signal or release the stored second phase difference pulse signal.

In one embodiment, the second storage subunit may include a third voltage-controlled switch component, a fourth voltage-controlled switch component, and a second capacitor.

A first end of the third voltage-controlled switch component may be connected with the third end of the third logical unit, a second end may be connected with the second end of the second frequency division subunit. The third voltage-controlled switch component may be configured to receive the second storage control signal, and may be turned on or off according to the second storage control signal.

A first end of the fourth voltage-controlled switch component may be connected with a third end of the third voltage-controlled switch component, a second end may be connected with the second end of the second frequency division subunit. The fourth voltage-controlled switch component may be configured to receive an inverted signal of the second storage control signal, and may be turned on or off according to the inverted signal of the second storage control signal.

A first end of the second capacitor may be connected with the third end of the third voltage-controlled switch component and the first end of the second detection circuit respectively, a second end may be connected with a third end of the fourth voltage-controlled switch component and the ground respectively. The second capacitor may be configured to store the second phase difference pulse signal or release the stored second phase difference pulse signal.

In one embodiment, the second storage subunit may further include a second diode.

A first end of the second diode may be connected with the third end of the third voltage-controlled switch component, a second end may be connected with the first end of the fourth voltage-controlled switch component.

In one embodiment, the second detection circuit may include a first voltage comparison unit and a second voltage comparison unit.

A positive input end of the first voltage comparison unit may be connected with a third end of the first controllable storage unit, a negative input end may be connected with a third end of the second controllable storage unit. The first voltage comparison unit may be configured to compare the first phase difference pulse signal and the second phase difference pulse signal to generate a first comparison result.

A positive input end of the second voltage comparison unit may be connected with the third end of the second controllable storage unit, a negative input end may be connected with the third end of the first controllable storage unit. The second voltage comparison unit may be configured to compare the second phase difference pulse signal and the first phase difference pulse signal to generate a second comparison result.

The first comparison result and the second comparison result may form the phase relationship.

Based on the same inventive concept, the application also provides a semiconductor memory, which may include the differential signal skew calibration circuit as described in any abovementioned embodiment.

The differential signal skew calibration circuit may acquire the phase relationship of the differential signals through the phase detection circuit. The phase adjustment control circuit may generate the phase calibration control instruction according to the phase relationship of the differential signals to control the phase calibration circuit to calibrate a phase skew of the input differential signals. The differential signal skew calibration circuit reduces difficulties in wiring in a PCB, namely the phase skew of the input differential signals may be automatically detected and calibrated through a circuit design, so that the quality of the differential signals is improved, and the cost is reduced.

BRIEF DESCRIPTION OF THE DRAWINGS

In order to describe the embodiments of the application more clearly, the drawings required to be used in descriptions about the embodiments will be simply introduced below. It is apparent that the drawings described below are only some embodiments of the application. Other drawings may further be obtained by those of ordinary skill in the art according to these drawings without creative work.

DESCRIPTIONS ABOUT THE REFERENCE SIGN NUMBERS

100-differential signal skew calibration circuit, 10-phase calibration circuit, 20-phase detection circuit, 210-first detection circuit, 211-first logical unit, 212-phase delay unit, 213-second logical unit, 214-third logical unit, 220-second detection circuit, 221-first voltage comparison unit, 222-second voltage comparison unit, 230-controllable storage circuit, 231-first controllable storage unit, 240-first frequency division subunit, 250-first storage subunit, 251-first voltage-controlled switch component, 252-second voltage-controlled switch component, 253-first capacitor, 254-first diode, 232-second controllable storage unit, 260-second frequency division subunit, 270-second storage subunit, 271-third voltage-controlled switch component, 272-fourth voltage-controlled switch component, 273-second capacitor, 274-second diode, and 30-phase adjustment control circuit.

DETAILED DESCRIPTION

In order to make the objectives, features, and advantages of the application clearer and easier to understand, specific implementation modes of the application will be described below in detail in combination with the drawings. Many specific details are described in the following descriptions to make the application understood adequately. However, the application may be implemented in many other manners different from those described here, those skilled in the art may make similar improvements without departing from the essence of the application, and thus the application is not limited to specific implementations disclosed below.

It is to be noted that, when an element is described as "fixed" on another element, it may be directly arranged on the other element or there may be an element therebetween. When a component is considered as "connected" to another component, it may be directly connected to the other component or a component may also exist therebetween.

In addition, terms "first" and "second" are only for description and should not be understood to indicate or imply relative importance or implicitly indicate the number of indicated technical features. Therefore, a feature defined by "first" and "second" may explicitly or implicitly indicate inclusion of one or more such features. In the descriptions of the application, "multiple" means two or more than two, unless otherwise limited definitely and specifically.

Unless otherwise defined, all technical and scientific terms used herein have the same meanings as commonly understood by those skilled in the art of the application. In the disclosure, terms used in the description of the application are only for a purpose of describing specific embodiments and not intended to limit the application. Term "and/or" used herein includes one or any and all combinations of multiple related items which are listed.

Figure 1:
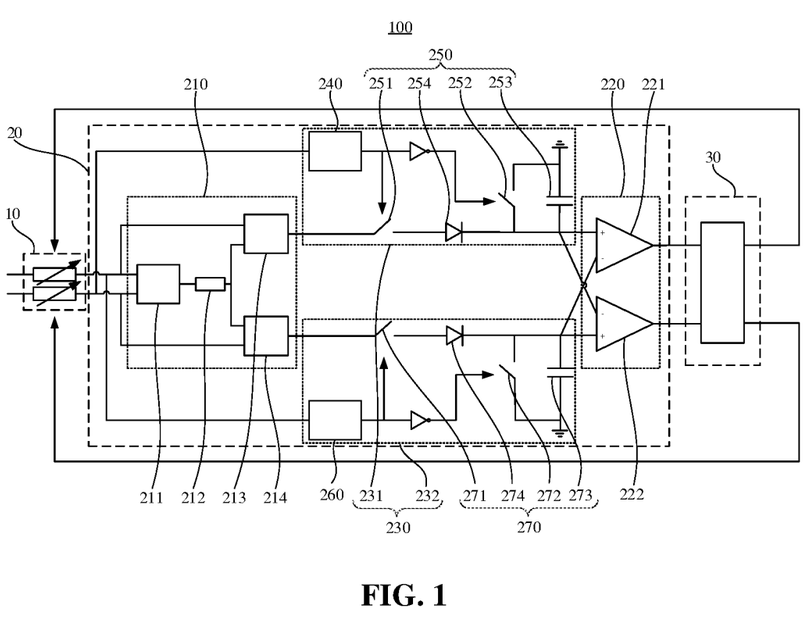
FIG. 1 is a structure diagram of a differential signal skew calibration circuit according to an embodiment of the application.

Referring to FIG. 1, the application provides a differential signal skew calibration circuit 100. The differential signal skew calibration circuit 100 includes a phase calibration circuit 10, a phase detection circuit 20, and a phase adjustment control circuit 30.

The phase calibration circuit 10 is configured to calibrate a phase of a differential signals.

A first end of the phase detection circuit 20 is connected with an output end of the phase calibration circuit 10. The phase detection circuit is configured to perform a preset logical operation on the differential signals to generate a phase difference pulse signal, and acquire a phase relationship of the differential signals according to the differential signals and the phase difference pulse signal.

A first end of the phase adjustment control circuit 30 is connected with a second end of the phase detection circuit 20, a second end is connected with a control end of the phase calibration circuit 10. The phase adjustment control circuit is configured to receive the phase relationship, generate a phase calibration control instruction according to the phase relationship, and send the instruction to the phase calibration circuit 10 to implement skew calibration of the differential signals.

In one embodiment, the differential signals input to the differential signal skew calibration circuit 100 may be, but not limited to, differential clock signals (CK_t, CK_c) or a differential data strobe signal (DQS_t, DQS_c). When the differential signals are input to the differential signal skew calibration circuit 100 for the first time, a phase of the differential signals may be detected through the phase detection circuit 20. The phase detection circuit 20 may generate the phase difference pulse signal according to a phase skew of the differential signals, and judge the phase relationship of the differential signals according to the differential signals and the phase difference pulse signal, and meanwhile, may convert different phase relationships into different high/low-level signal combinations for output. The phase adjustment control circuit 30 may include an adjustable delay control logical unit. The adjustable delay control logical unit may judge a phase skew condition of the differential signals according to a high/low-level signal combination output by the phase detection circuit 20, and generate a corresponding phase calibration control instruction for sending to the phase calibration circuit 10.

In one embodiment, the phase calibration circuit 10 may include two adjustable delay units. Each adjustable delay unit controls one signal in the differential signals, namely each adjustable delay unit may adjust a phase delay of the corresponding differential signals according to the phase calibration control instruction sent by the phase adjustment control circuit 30 to implement calibration of the phase skew of the differential signals.

It can be understood that the differential signal skew calibration circuit 100 may acquire the phase relationship of the differential signals through the phase detection circuit 20. The phase adjustment control circuit 30 may generate the phase calibration control instruction according to the phase relationship of the differential signals to control the phase calibration circuit 10 to calibrate the phase skew of the input differential signals. The differential signal skew calibration circuit 100 reduces difficulties in wiring design of a PCB, namely the phase skew of the input differential signals may be automatically detected and calibrated through a circuit design, so that the quality of the differential signals is improved, and the cost is reduced.

In one embodiment, the phase detection circuit 20 includes a first detection circuit 210 and a second detection circuit 220.

A first end of the first detection circuit 210 is connected with the output end of the phase calibration circuit 10. The first detection circuit is configured to perform the preset logical operation on the differential signals to generate a first phase difference pulse signal and a second phase difference pulse signal. In the embodiment, the first end of the first detection circuit 210 may be a signal input end, a second end may be a signal output end. It can be understood that the first phase difference pulse signal and the second phase difference pulse signal include information of a phase difference of the differential signals, and may be configured to judge the phase relationship of the differential signals.

A first end of the second detection circuit 220 is connected with a second end of the first detection circuit 210, a second end is connected with the first end of the phase adjustment control circuit 30. The second detection circuit is configured to compare amplitudes of the first phase difference pulse signal and the second phase difference pulse signal to acquire the phase relationship, and send the phase relationship to the phase adjustment control circuit 30. In the embodiment, the first end of the second detection circuit 220 may be a signal input end, the second end may be a signal output end. It can be understood that, since the first phase difference pulse signal and the second phase difference pulse signal may reflect the phase difference of the differential signals, the amplitudes of the first phase difference pulse signal and the second phase difference pulse signal may be compared to obtain the phase relationship of the differential signals, i.e., a phase relationship of lead, lag, or inversion.

In one embodiment, the second detection circuit 220 may convert the phase relationship of the differential signals into a combination of high levels and/or low levels, and send it to the phase adjustment control circuit 30.

Figure 2:
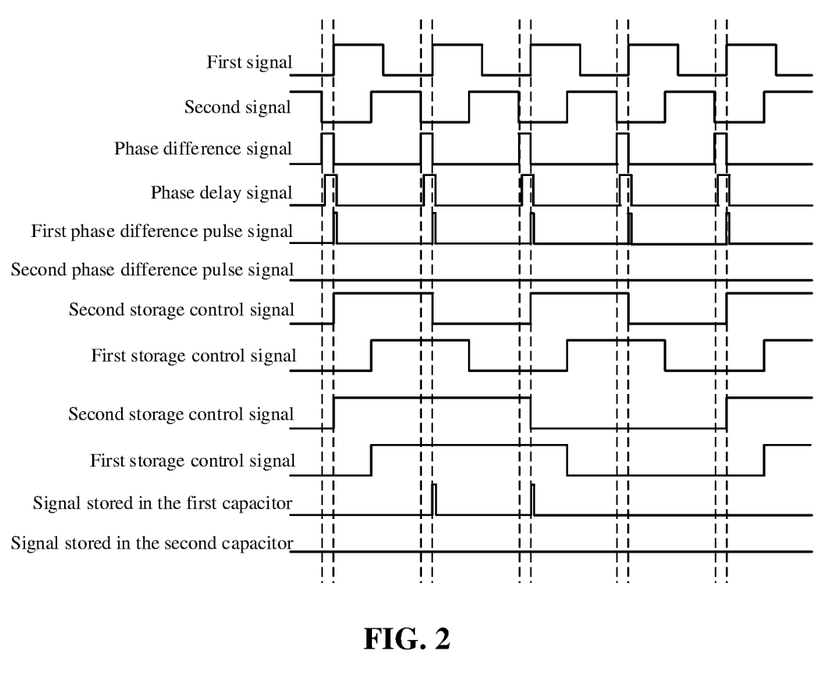
FIG. 2 is a time sequence diagram of a differential signal skew calibration circuit according to an embodiment of the application.

Referring to FIG. 2 together, in one embodiment, the first detection circuit 210 includes a first logical unit 211, a phase delay unit 212, a second logical unit 213, and a third logical unit 214.

A first end of the first logical unit 211 is connected with the first end of the phase calibration circuit 10, a second end is connected with a second end of the phase calibration circuit 10. The first logical unit is configured to perform a first logical operation on a first signal and second signal in the differential signals to generate a phase difference signal. The first end of the phase calibration circuit 10 and the second end of the phase calibration circuit 10 form the output end of the phase calibration circuit 10. In the embodiment, the first end and second end of the first logical unit 211 may be signal input ends, while a third end may be a signal output end.

In one embodiment, the first logical unit 211 may be a logical NOR unit, and namely includes a NOR gate, so that the first logical operation may be a logical NOR operation. In the embodiment, the logical NOR operation may be performed on the first signal and the second signal to detect a phase delay between the first signal and the second signal, referring to a time sequence diagram of a phase difference signal in FIG. 2.

A first end of the phase delay unit 212 is connected with a third end of the first logical unit 211. The phase delay unit is configured to perform phase delay processing on the phase difference signal to generate a phase delay signal. In the embodiment, the first end of the phase delay unit 212 may be a signal input end, a second end may be a signal output end.

In one embodiment, the phase delay unit 212 may include, but not limited to, a delay line, to delay the input phase difference signal. The phase delay unit 212 may be arranged to generate the phase delay signal. In the embodiment, the phase delay unit 212 may control the delay of the phase difference signal in a preset range to convert the phase difference signal into the phase difference pulse signal, referring to the time sequence diagram of the phase delay signal in FIG. 2.

A first end of the second logical unit 213 is connected with the first end of the phase calibration circuit 10, a second end is connected with a second end of the phase delay unit 212. The second logical unit is configured to perform a second logical operation on the phase delay signal and the first signal to generate the first phase difference pulse signal. In the embodiment, the first end and second end of the second logical unit 213 may be signal input ends, a third end may be a signal output end.

In one embodiment, the second logical unit 213 may be a logical AND unit, and namely includes an AND gate, so that the second logical operation may be a logical AND operation. In the embodiment, the second logical unit 213 may perform the logical AND operation on the first signal and the phase delay signal, referring to a time sequence diagram of the first phase difference pulse signal in FIG. 2.

A first end of the third logical unit 214 is connected with the second end of the phase calibration circuit 10, a second end is connected with the second end of the phase delay unit 212. The third logical unit is configured to perform a third logical operation on the phase delay signal and the second signal to generate the second phase difference pulse signal. In the embodiment, the first end and second end of the third logical unit 214 may be signal input ends, a third end may be a signal output end.

In one embodiment, the third logical unit 214 may be a logical AND unit, and namely includes an AND gate, so that the third logical operation may be a logical AND operation. In the embodiment, the third logical unit 214 may perform the logical AND operation on the second signal and the phase delay signal, referring to a time sequence diagram of the second phase difference pulse signal in FIG. 2. It can be understood that the first phase difference pulse signal and the second phase difference pulse signal include information of the phase relationship between the first signal and the second signal, and may be used for the judgment of the phase relationship between the first signal and the second signal.

In one embodiment, the first logical unit 211 in the first detection circuit 210 may acquire the phase delay of the differential signals, and the phase delay unit 212, the second logical unit 213 and the third logical unit 214 may acquire the first phase difference pulse signal and the second phase difference pulse signal. The second detection circuit 220 may compare between the amplitudes of the first phase difference pulse signal and the second phase difference pulse signal to acquire the phase relationship of lead, lag or inversion of the differential signals. Therefore, the phase adjustment control circuit 30 may generate the phase calibration control instruction according to the phase delay and the phase relationship, and send the phase calibration control instruction to the phase calibration circuit 10 to implement skew calibration of the differential signals.

In one embodiment, the phase detection circuit 20 further includes a controllable storage circuit 230, of which a first end is connected with the output end of the phase calibration circuit 10, a second end is connected with the second end of the first detection circuit 210, and a third end is connected with the first end of the second detection circuit 220. The controllable storage circuit is configured to store the first phase difference pulse signal and the second phase difference pulse signal according to a period of the differential signals. In the embodiment, the first end and second end of the controllable storage circuit 230 may be signal input ends, the third end may be a signal output end.

In one embodiment, since a signal output by the first detection circuit 210 and reflecting the phase difference of the differential signals is a pulse signal, i.e., the first phase difference pulse signal and the second phase difference pulse signal, and a single pulse signal is unfavorable for extraction of the phase relationship of the differential signals, the controllable storage circuit 230 may be arranged to store multiple first phase difference pulse signals and multiple second phase difference pulse signals to improve the accuracy of the phase relationship, acquired by the second detection circuit 220, of the differential signals and further improve the calibration accuracy of the differential signal skew calibration circuit 100.

In one embodiment, the controllable storage circuit 230 includes a first controllable storage unit 231 and a second controllable storage unit 232.

A first end of the first controllable storage unit 231 is connected with the second end of the phase calibration circuit 10, a second end is connected with a third end of the second logical unit 213, and a third end is connected with the first end of the second detection circuit 220. The first controllable storage unit is configured to generate a first storage control signal according to a period of the second signal, and receive and store, according to the first storage control signal, the first phase difference pulse signal or release the stored first phase difference pulse signal. In the embodiment, the first end and second end of the first controllable storage unit 231 may be signal input ends, the third end may be a signal output end.

A first end of the second controllable storage unit 232 is connected with the first end of the phase calibration circuit 10, a second end is connected with a third end of the third logical unit 214, and a third end is connected with the first end of the second detection circuit 220. The second controllable storage unit is configured to generate a second storage control signal according to a period of the first signal, and receive and store, according to the second storage control signal, the second phase difference pulse signal or release the stored first phase difference pulse signal. In the embodiment, the first end and second end of the second controllable storage unit 232 may be signal input ends, the third end may be a signal output end.

In one embodiment, the first controllable storage unit 231 includes a first frequency division subunit 240 and a first storage subunit 250.

A first end of the first frequency division subunit 240 is connected with the second end of the phase calibration circuit 10. The first frequency division subunit is configured to generate the first storage control signal according to the period of the second signal. In the embodiment, the first end of the first frequency division subunit 240 may be a signal input end, a second end may be a signal output end.

In one embodiment, the first frequency division subunit 240 may include an adjustable frequency division circuit. The arranged adjustable frequency division circuit may enlarge a frequency range of the differential signal skew calibration circuit. Since the first frequency division subunit 240 generates the first storage control signal according to the period of the second signal, the adjustable frequency division circuit may output a signal of which a frequency is one in integer of a frequency of the second signal as the first storage control unit, referring to a time sequence diagram of the first storage control signal in FIG. 2. In other words, the frequency of the second signal may be an integral multiple of the frequency of the signal output by the adjustable frequency division circuit. It can be understood that the specific frequency of the first storage control signal may be set as practically required. For example, for a time sequence of two first storage control signals in FIG. 2, the frequency of the one first storage control signal is half of the frequency of the second signal, and the frequency of the other first storage control signal is a quarter of the frequency of the second signal.

It can be understood that the frequency of the first storage control signal determines a period of the first storage control signal, and if the period of the first storage control signal is longer, the first storage subunit 250 may store more first phase difference pulse signals, and the calibration accuracy of the differential signal skew calibration circuit is higher. However, if the period of the first storage control signal is too long, the processing speed of the differential signal skew calibration circuit may decrease. Therefore, the processing speed of the differential signal skew calibration circuit and the calibration accuracy of the differential signal skew calibration circuit may be comprehensively considered when the specific frequency of the first storage control signal is selected.

A first end of the first storage subunit 250 is connected with the third end of the second logical unit 213, a second end is connected with a second end of the first frequency division subunit 240, and a third end is connected with the first end of the second detection circuit 220. The first storage subunit is configured to receive the first storage control signal, and store the first phase difference pulse signal according to the first storage control signal or release the stored first phase difference pulse signal. In the embodiment, the first end and second end of the first storage subunit 250 are signal input ends, the third end is a signal output end.

In one embodiment, the first storage subunit 250 includes a first voltage-controlled switch component 251, a second voltage-controlled switch component 252, and a first capacitor 253.

A first end of the first voltage-controlled switch component 251 is connected with the third end of the second logical unit 213, a second end is connected with the second end of the first frequency division subunit 240. The first voltage-controlled switch component is configured to receive the first storage control signal, and is turned on or off according to the first storage control signal. In the embodiment, the first end of the first voltage-controlled switch component 251 may be a signal input end, the second end may be a control end, a third end may be a signal output end.

A first end of the second voltage-controlled switch component 252 is connected with a third end of the first voltage-controlled switch component 251, a second end is connected with the second end of the first frequency division subunit 240. The second voltage-controlled switch component is configured to receive an inverted signal of the first storage control signal, and is turned on or off according to the inverted signal of the first storage control signal. In the embodiment, the first end of the second voltage-controlled switch component 252 may be a signal input end, the second end may be a control end, a third end may be a signal output end.

In one embodiment, the second voltage-controlled switch component 252 may include a logical NOT unit, i.e., an NOT gate. After the first storage control signal output by the first frequency division subunit 240 through the second end passes through the NOT gate, the inverted signal of the first storage control signal may be obtained. Therefore, the second voltage-controlled switch component 252 may be turned on or off according to the inverted signal of the first storage control signal.

A first end of the first capacitor 253 is connected with the third end of the first voltage-controlled switch component 251 and the first end of the second detection circuit 220 respectively, a second end is connected with a third end of the second voltage-controlled switch component 252 and a ground respectively. The first capacitor is configured to store the first phase difference pulse signal or release the stored first phase difference pulse signal.

In one embodiment, the first voltage-controlled switch component 251 may receive the first storage control signal, and may be turned on or off according to the first storage control signal. For example, when the first storage control signal is at a high level, the first voltage-controlled switch component 251 is turned on, the second voltage-controlled switch component 252 is turned off, and the second logical unit 213 outputs the first phase difference pulse signal to the first capacitor through the third end of the second logical unit, namely the first capacitor 253 is charged. When the first storage control signal is at a low level, the first voltage-controlled switch component 251 is turned off, the second voltage-controlled switch component 252 is turned on, and the first capacitor 253 releases the stored first phase difference pulse signal through the first end of the first capacitor.

In one embodiment, the first storage subunit 250 further includes a first diode 254, of which a first end is connected with a third end of the first voltage-controlled switch component 251, and a second end is connected with the first end of the second voltage-controlled switch component 252. In the embodiment, the first end of the first diode 254 may be a signal input end, the second end may be a signal output end. It can be understood that the first diode 254 may limit a direction of an electrical signal. Compared with an integrating circuit in the related art, the arranged first diode 254 and second diode 274 may increase a recognition speed of the first phase difference pulse signal and the second phase difference pulse signal, and may also increase a difference between the first phase difference pulse signal and the second phase difference pulse signal to ensure the final calibration accuracy of the differential signal skew calibration circuit.

In one embodiment, the second controllable storage unit 232 includes a second frequency division subunit 260 and a second storage subunit 270.

A first end of the second frequency division subunit 260 is connected with the first end of the phase calibration circuit 10. The second frequency division subunit is configured to generate the second storage control signal according to the period of the first signal.

A first end of the second storage subunit 270 is connected with the third end of the third logical unit 214, a second end is connected with a second end of the second frequency division subunit 260, and a third end is connected with the first end of the second detection circuit 220. The second storage subunit is configured to receive the second storage control signal, and store the second phase difference pulse signal according to the second storage control signal or release the stored second phase difference pulse signal.

It can be understood that the second frequency division subunit 260 may be the same as the first frequency division subunit 240 in any abovementioned embodiment, and the second storage subunit 270 may be the same as the first storage subunit 250 in any abovementioned embodiment. Elaborations are omitted herein.

In one embodiment, the second storage subunit 270 includes a third voltage-controlled switch component 271, a fourth voltage-controlled switch component 272, and a second capacitor 273.

A first end of the third voltage-controlled switch component 271 is connected with the third end of the third logical unit 214, a second end is connected with the second end of the second frequency division subunit 260. The third voltage-controlled switch component is configured to receive the second storage control signal, and is turned on or off according to the second storage control signal.

A first end of the fourth voltage-controlled switch component 272 is connected with a third end of the third voltage-controlled switch component 271, a second end is connected with the second end of the second frequency division subunit 260. The fourth voltage-controlled switch component is configured to receive an inverted signal of the second storage control signal, and is turned on or off according to the inverted signal of the second storage control signal.

A first end of the second capacitor 273 is connected with the third end of the third voltage-controlled switch component 271 and the first end of the second detection circuit 220 respectively, a second end is connected with a third end of the fourth voltage-controlled switch component 272 and the ground respectively. The second capacitor is configured to store the second phase difference pulse signal or release the stored second phase difference pulse signal.

In one embodiment, the second storage subunit 270 further includes a second diode 274 of which a first end is connected with a third end of the third voltage-controlled switch component 271, and a second end is connected with the first end of the fourth voltage-controlled switch component 272.

It can be understood that the third voltage-controlled switch component 271 may be the same as the first voltage-controlled switch component 251 in any abovementioned embodiment, the fourth voltage-controlled switch component 272 may be the same as the second voltage-controlled switch component 252 in any abovementioned embodiment, the second capacitor 273 may be the same as the first capacitor 253 in any abovementioned embodiment, and the second diode 274 may be the same as the first diode 254 in any abovementioned embodiment. Elaborations are omitted herein.

In one embodiment, the second detection circuit 220 includes a first voltage comparison unit 221 and a second voltage comparison unit 222.

A positive input end of the first voltage comparison unit 221 is connected with a third end of the first controllable storage unit 231, a negative input end is connected with a third end of the second controllable storage unit 232. The first voltage comparison unit is configured to compare the first phase difference pulse signal and the second phase difference pulse signal to generate a first comparison result.

A positive input end of the second voltage comparison unit 222 is connected with the third end of the second controllable storage unit 232, a negative input end is connected with the third end of the first controllable storage unit 231. The second voltage comparison unit is configured to compare the second phase difference pulse signal and the first phase difference pulse signal to generate a second comparison result. The first comparison result and the second comparison result form the phase relationship. In one embodiment, each of the first voltage comparison unit 221 and the second voltage comparison unit 222 may be a voltage comparator, and has many advantages such as simple structure, high detection speed, and wide applicable frequency range.

Figure 3:
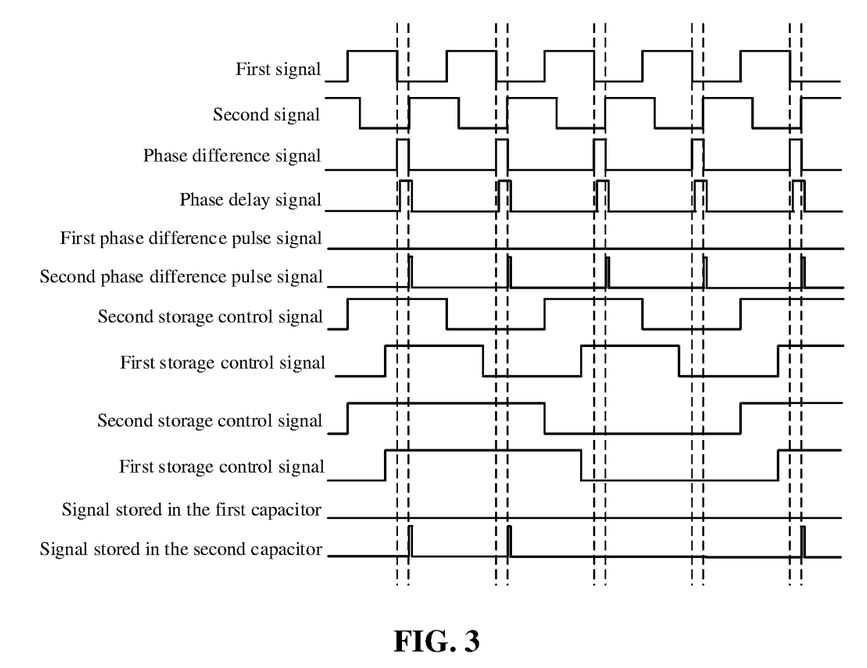
FIG. 3 is a time sequence diagram of another differential signal skew calibration circuit according to an embodiment of the application.

In one embodiment, referring to FIG. 2, when the output of the first voltage comparison unit 221 is at a high level, and the output of the second voltage comparison unit 222 is at a low level, the second signal is delayed. Referring to FIG. 3, when the output of the first voltage comparison unit 221 is at a low level, and the output of the second voltage comparison unit 222 is at a high level, the first signal is delayed. It can be understood that, when both of the outputs of the first voltage comparison units 221 and the second voltage comparison unit 222 are at low levels, the phase relationship between the second signal and the first signal is inversion, namely the two signals are completely inverted, and in such case, phase delay adjustment is not required.

Based on the same inventive concept, the application also provides a semiconductor memory. The semiconductor memory includes the differential signal skew calibration circuit as described in any abovementioned embodiment, and elaborations are omitted herein.

Each technical feature of the abovementioned embodiments may be combined freely. For simplicity of description, not all possible combinations of the abovementioned embodiments are described. However, any combination of these technical features shall fall within the scope recorded in the specification without conflicting.

The abovementioned embodiments only express some implementation modes of the application and are specifically described in detail and not thus understood as limits to the patent scope of the application. It is to be pointed out that those of ordinary skill in the art may further make a plurality of transformations and improvements without departing from the concept of the application and all of these fall within the scope of protection of the application. Therefore, the scope of patent protection of the application should be salient object to the appended claims.

What is claimed is:

1. A differential signal skew calibration circuit, comprising:
   a phase calibration circuit, configured to calibrate a phase of differential signals;
   a phase detection circuit, a first end of the phase detection circuit being connected with an output end of the phase calibration circuit, wherein the phase detection circuit is configured to perform a preset logical operation on the differential signals to generate a phase difference pulse signal, and acquire a phase relationship of the differential signals according to the differential signals and the phase difference pulse signal; and
   a phase adjustment control circuit, a first end of the phase adjustment control circuit being connected with a second end of the phase detection circuit, a second end of the phase adjustment control circuit being connected with a control end of the phase calibration circuit, wherein the phase adjustment control circuit is configured to receive the phase relationship, generate a phase calibration control instruction according to the phase relationship, and send the phase calibration control instruction to the phase calibration circuit to implement skew calibration of the differential signals;
   wherein the phase detection circuit comprises:
   a first detection circuit, a first end of the first detection circuit being connected with the output end of the phase calibration circuit, wherein the first detection circuit is configured to perform the preset logical operation on the differential signals to generate a first phase difference pulse signal and a second phase difference pulse signal; and
   a second detection circuit, a first end of the second detection circuit being connected with a second end of the first detection circuit, a second end of the second detection circuit being connected with the first end of the phase adjustment control circuit, wherein the second detection circuit is configured to compare between amplitudes of the first phase difference pulse signal and the second phase difference pulse signal to obtain the phase relationship, and send the phase relationship to the phase adjustment control circuit.

2. The differential signal skew calibration circuit of claim 1, wherein the first detection circuit comprises:
   a first logical circuit, a first end of the first logical circuit being connected with a first end of the phase calibration circuit, a second end of the first logical circuit being connected with a second end of the phase calibration circuit, wherein the first logical circuit is configured to perform a first logical operation on a first signal and a second signal in the differential signals to generate a phase difference signal, wherein the first end of the phase calibration circuit and the second end of the phase calibration circuit form the output end of the phase calibration circuit;
   a phase delay circuit, a first end of the phase delay circuit being connected with a third end of the first logical circuit, wherein the phase delay circuit is configured to perform phase delay processing on the phase difference signal to generate a phase delay signal;
   a second logical circuit, a first end of the second logical circuit being connected with the first end of the phase calibration circuit, a second end of the second logical circuit being connected with a second end of the phase delay circuit, wherein the second logical circuit is configured to perform a second logical operation on the phase delay signal and the first signal to generate the first phase difference pulse signal; and
   a third logical circuit, a first end of the third logical circuit being connected with the second end of the phase calibration circuit, a second end of the third logical circuit being connected with the second end of the phase delay circuit, wherein the third logical circuit is configured to perform a third logical operation on the phase delay signal and the second signal to generate the second phase difference pulse signal.

3. The differential signal skew calibration circuit of claim 2, wherein the first logical circuit comprises a NOR gate, the second logical circuit comprises an AND gate, and the third logical circuit comprises a second AND gate.

4. The differential signal skew calibration circuit of claim 2, wherein the phase detection circuit further comprises:
a controllable storage circuit, a first end of the controllable storage circuit being connected with the output end of the phase calibration circuit, a second end of the controllable storage circuit being connected with the second end of the first detection circuit, a third end of the controllable storage circuit being connected with the first end of the second detection circuit, wherein the controllable storage circuit is configured to store the first phase difference pulse signal and the second phase difference pulse signal according to a period of the differential signals.

5. The differential signal skew calibration circuit of claim 4, wherein the controllable storage circuit comprises:
a first controllable storage circuit, a first end of the first controllable storage circuit being connected with the second end of the phase calibration circuit, a second end of the first controllable storage circuit being connected with a third end of the second logical circuit, a third end of the first controllable storage circuit being connected with the first end of the second detection circuit, wherein the first controllable storage circuit is configured to generate a first storage control signal according to a period of the second signal, and receive and store, according to the first storage control signal, the first phase difference pulse signal or release the stored first phase difference pulse signal; and
a second controllable storage circuit, a first end of the second controllable storage circuit being connected with the first end of the phase calibration circuit, a second end of the second controllable storage circuit being connected with a third end of the third logical circuit, a third end of the second controllable storage circuit being connected with the first end of the second detection circuit, wherein the second controllable storage circuit is configured to generate a second storage control signal according to a period of the first signal, receive the second phase difference pulse signal, and perform at least one of storage or release of the second phase difference pulse signal according to the second storage control signal.

6. The differential signal skew calibration circuit of claim 5, wherein the first controllable storage circuit comprises:
a first frequency division sub-circuit, a first end of the first frequency division sub-circuit being connected with the second end of the phase calibration circuit, wherein the first frequency division sub-circuit is configured to generate the first storage control signal according to the period of the second signal; and
a first storage sub-circuit, a first end of the first storage sub-circuit being connected with the third end of the second logical circuit, a second end of the first storage sub-circuit being connected with a second end of the first frequency division sub-circuit, a third end of the first storage sub-circuit being connected with the first end of the second detection circuit, wherein the first storage sub-circuit is configured to receive the first storage control signal, and perform at least one of storage or release of the first phase difference pulse signal according to the first storage control signal.

7. The differential signal skew calibration circuit of claim 6, wherein the first storage sub-circuit comprises:
a first voltage-controlled switch, a first end of the first voltage-controlled switch being connected with the third end of the second logical circuit, a second end of the first voltage-controlled switch being connected with the second end of the first frequency division sub-circuit, wherein the first voltage-controlled switch is configured to receive the first storage control signal, and is turned on or off according to the first storage control signal;
a second voltage-controlled switch, a first end of the second voltage-controlled switch being connected with a third end of the first voltage-controlled switch, a second end of the second voltage-controlled switch being connected with the second end of the first frequency division sub-circuit, wherein the second voltage-controlled switch is configured to receive an inverted signal of the first storage control signal, and is turned on or off according to the inverted signal of the first storage control signal; and
a first capacitor, a first end of the first capacitor being connected with the third end of the first voltage-controlled switch and the first end of the second detection circuit respectively, a second end of the first capacitor being connected with a third end of the second voltage-controlled switch and a ground respectively, wherein the first capacitor is configured to store the first phase difference pulse signal or release the stored first phase difference pulse signal.

8. The differential signal skew calibration circuit of claim 7, wherein the first storage sub-circuit further comprises:
a first diode, a first end of the first diode being connected with the third end of the first voltage-controlled switch, a second end of the first diode being connected with the first end of the second voltage-controlled switch.

9. The differential signal skew calibration circuit of claim 5, wherein the second controllable storage circuit comprises:
a second frequency division sub-circuit, a first end of the second frequency division sub-circuit being connected with the first end of the phase calibration circuit, wherein the second frequency division sub-circuit is configured to generate the second storage control signal according to the period of the first signal; and
a second storage sub-circuit, a first end of the second storage sub-circuit being connected with the third end of the third logical circuit, a second end of the second storage sub-circuit being connected with a second end of the second frequency division sub-circuit, and a third end of the second storage sub-circuit being connected with the first end of the second detection circuit, wherein the second storage sub-circuit is configured to receive the second storage control signal, and perform at least one of storage or release of the second phase difference pulse signal according to the second storage control signal.

10. The differential signal skew calibration circuit of claim 9, wherein the second storage sub-circuit comprises:
a third voltage-controlled switch, a first end of the third voltage-controlled switch being connected with the third end of the third logical circuit, a second end of the third voltage-controlled switch being connected with the second end of the second frequency division sub-circuit, wherein the third voltage-controlled switch is configured to receive the second storage control signal, and is turned on or off according to the second storage control signal;

a fourth voltage-controlled switch, a first end of the fourth voltage-controlled switch being connected with a third end of the third voltage-controlled switch, a second end of the fourth voltage-controlled switch being connected with the second end of the second frequency division sub-circuit, wherein the fourth voltage-controlled switch is configured to receive an inverted signal of the second storage control signal, and is turned on or off according to the inverted signal of the second storage control signal; and a second capacitor, a first end of the second capacitor being connected with the third end of the third voltage-controlled switch and the first end of the second detection circuit respectively, a second end of the second capacitor being connected with a third end of the fourth voltage-controlled switch and a ground respectively, wherein the second capacitor is configured to store the second phase difference pulse signal or release the stored second phase difference pulse signal.

11. The differential signal skew calibration circuit of claim 10, wherein the second storage sub-circuit further comprises:

a second diode, a first end of the second diode being connected with the third end of the third voltage-controlled switch, a second end of the second diode being connected with the first end of the fourth voltage-controlled switch.

12. The differential signal skew calibration circuit of claim 5, wherein the second detection circuit comprises:

a first voltage comparison circuit, a positive input end of the first voltage comparison circuit being connected with the third end of the first controllable storage circuit, a negative input end of the first voltage comparison circuit being connected with the third end of the second controllable storage circuit, wherein the first voltage comparison circuit is configured to compare the first phase difference pulse signal and the second phase difference pulse signal to generate a first comparison result; and a second voltage comparison circuit, a positive input end of the second voltage comparison circuit being connected with the third end of the second controllable storage circuit, a negative input end of the second voltage comparison circuit being connected with the third end of the first controllable storage circuit, wherein the second voltage comparison circuit is configured to compare the second phase difference pulse signal and the first phase difference pulse signal to generate a second comparison result, wherein the first comparison result and the second comparison result form the phase relationship.

13. A semiconductor memory, comprising a differential signal skew calibration circuit, wherein the differential signal skew calibration circuit comprises:

a phase calibration circuit, configured to calibrate a phase of differential signals;

a phase detection circuit, a first end of the phase detection circuit being connected with an output end of the phase calibration circuit, wherein the phase detection circuit is configured to perform a preset logical operation on the differential signals to generate a phase difference pulse signal, and acquire a phase relationship of the differential signals according to the differential signals and the phase difference pulse signal; and a phase adjustment control circuit, a first end of the phase adjustment control circuit being connected with a second end of the phase detection circuit, a second end of the phase adjustment control circuit being connected with a control end of the phase calibration circuit, wherein the phase adjustment control circuit is configured to receive the phase relationship, generate a phase calibration control instruction according to the phase relationship, and send the phase calibration control instruction to the phase calibration circuit to implement skew calibration of the differential signals;

the phase detection circuit comprises:

a first detection circuit, a first end of the first detection circuit being connected with the output end of the phase calibration circuit, wherein the first detection circuit is configured to perform the preset logical operation on the differential signals to generate a first phase difference pulse signal and a second phase difference pulse signal; and a second detection circuit, a first end of the second detection circuit being connected with a second end of the first detection circuit, a second end of the second detection circuit being connected with the first end of the phase adjustment control circuit, wherein the second detection circuit is configured to compare between amplitudes of the first phase difference pulse signal and the second phase difference pulse signal to obtain the phase relationship, and send the phase relationship to the phase adjustment control circuit.

14. The semiconductor memory of claim 13, wherein the first detection circuit comprises:

a first logical circuit, a first end of the first logical circuit being connected with a the first end of the phase calibration circuit, a second end of the first logical circuit being connected with a second end of the phase calibration circuit, wherein the first logical circuit is configured to perform a first logical operation on a first signal and a second signal in the differential signals to generate a phase difference signal, wherein the first end of the phase calibration circuit and the second end of the phase calibration circuit form the output end of the phase calibration circuit;

a phase delay circuit, a first end of the phase delay circuit being connected with a third end of the first logical circuit, wherein the phase delay circuit is configured to perform phase delay processing on the phase difference signal to generate a phase delay signal;

a second logical circuit, a first end of the second logical circuit being connected with the first end of the phase calibration circuit, a second end of the second logical circuit being connected with a second end of the phase delay circuit, wherein the second logical circuit is configured to perform a second logical operation on the phase delay signal and the first signal to generate the first phase difference pulse signal; and a third logical circuit, a first end of the third logical circuit being connected with the second end of the phase calibration circuit, a second end of the third logical circuit being connected with the second end of the phase delay circuit, wherein the third logical circuit is configured to perform a third logical operation on the phase delay signal and the second signal to generate the second phase difference pulse signal.

15. The semiconductor memory of claim 14, wherein the first logical circuit comprises a NOR gate, the second logical circuit comprises an AND gate, and the third logical circuit comprises a second AND gate.

16. The semiconductor memory of claim 14, wherein the phase detection circuit further comprises:

a controllable storage circuit, a first end of the controllable storage circuit being connected with the output end of the phase calibration circuit, a second end of the controllable storage circuit being connected with the second end of the first detection circuit, a third end of the controllable storage circuit being connected with the first end of the second detection circuit, wherein the controllable storage circuit is configured to store the first phase difference pulse signal and the second phase difference pulse signal according to a period of the differential signals.

17. The semiconductor memory of claim 16, wherein the controllable storage circuit comprises:

a first controllable storage circuit, a first end of the first controllable storage circuit being connected with the second end of the phase calibration circuit, a second end of the first controllable storage circuit being connected with a third end of the second logical circuit, a third end of the first controllable storage circuit being connected with the first end of the second detection circuit, wherein the first controllable storage circuit is configured to generate a first storage control signal according to a period of the second signal, and receive and store, according to the first storage control signal, the first phase difference pulse signal or release the stored first phase difference pulse signal; and a second controllable storage circuit, a first end of the second controllable storage circuit being connected with the first end of the phase calibration circuit, a second end of the second controllable storage circuit being connected with a third end of the third logical circuit, a third end of the second controllable storage circuit being connected with the first end of the second detection circuit, wherein the second controllable storage circuit is configured to generate a second storage control signal according to a period of the first signal, receive the second phase difference pulse signal, and perform at least one of storage or release of the second phase difference pulse signal according to the second storage control signal.

18. The semiconductor memory of claim 17, wherein the first controllable storage circuit comprises:

a first frequency division sub-circuit, a first end of the first frequency division sub-circuit being connected with the second end of the phase calibration circuit, wherein the first frequency division sub-circuit is configured to generate the first storage control signal according to the period of the second signal; and a first storage sub-circuit, a first end of the first storage sub-circuit being connected with the third end of the second logical circuit, a second end of the first storage sub-circuit being connected with a second end of the first frequency division sub-circuit, a third end of the first storage sub-circuit being connected with the first end of the second detection circuit, wherein the first storage sub-circuit is configured to receive the first storage control signal, and perform at least one of storage or release of the first phase difference pulse signal according to the first storage control signal.

* * * * *